United States Patent [19]
Williams

[11] Patent Number: 5,979,312
[45] Date of Patent: Nov. 9, 1999

[54] SUPPORT FRAME AND STENCIL HAVING FLEXIBLE END REGIONS FOR ATTACHMENT TO THE SUPPORT FRAME

[75] Inventor: David Godfrey Williams, Merseyside, United Kingdom

[73] Assignee: Alpha Fry Ltd., Surrey, United Kingdom

[21] Appl. No.: 08/918,921

[22] Filed: Aug. 26, 1997

Related U.S. Application Data

[63] Continuation of application No. 08/182,030, filed as application No. PCT/GB93/01021, May 19, 1993, abandoned.

[30] Foreign Application Priority Data

| Jun. 3, 1992 | [GB] | United Kingdom | 9211761 |
| Oct. 1, 1992 | [GB] | United Kingdom | 9220733 |

[51] Int. Cl.⁶ ............................. B41N 1/24; B41F 15/36
[52] U.S. Cl. .................. 101/127; 101/127.1; 101/128.1
[58] Field of Search .................... 101/114, 127, 101/127.1, 128.1, 129, 481, 485, 486, DIG. 36; 33/617, 621; 118/406; 427/282

[56] References Cited

U.S. PATENT DOCUMENTS

| 2,925,774 | 2/1960 | Scheeler | 101/127.1 |
| 3,049,993 | 8/1962 | Kobrin | 101/127.1 |
| 3,167,004 | 1/1965 | Miller et al. | 101/127.1 |
| 3,176,843 | 4/1965 | Hoskins et al. | 101/127.1 |
| 3,922,804 | 12/1975 | Batey | 38/102.91 |
| 4,515,077 | 5/1985 | Davidson et al. | 101/128.1 |
| 4,967,655 | 11/1990 | Holderegger et al. | 101/128.1 |
| 5,097,761 | 3/1992 | Hamu | 101/127.1 |
| 5,111,743 | 5/1992 | Umaba et al. | 101/127 |
| 5,136,797 | 8/1992 | Hildebrandt | 101/127.1 |
| 5,152,219 | 10/1992 | Adachi et al. | 101/127 |
| 5,322,014 | 6/1994 | Keller | 101/415.1 |
| 5,347,925 | 9/1994 | Holderegger | 101/127 |
| 5,606,911 | 3/1997 | Cane | 101/127 |
| 5,606,912 | 3/1997 | Cane | 101/127 |

FOREIGN PATENT DOCUMENTS

| 953973 | 9/1974 | Canada | 101/127.1 |
| 1012371 | 7/1952 | France . | |
| 200393 | 5/1983 | Germany | 101/127.1 |
| 3227434 | 1/1984 | Germany . | |
| 9017591 | 5/1991 | Germany . | |
| 58-114953 | 7/1983 | Japan | 101/127.1 |
| 64-22552 | 1/1989 | Japan | 101/127 |
| 1299822 | 3/1987 | U.S.S.R. | 101/127.1 |
| 08616 | 5/1992 | WIPO . | |

OTHER PUBLICATIONS

IBM Disclosure Bulletin, vol. 16 No. 7, Dec. 1973, "Uniform Tensioning of Screen Mesh to Frame", Crimi et al., p. 2114, cl. 101 sub 127.1.

*Primary Examiner*—Stephen R. Funk
*Attorney, Agent, or Firm*—Mintz, Levin, Cohn, Ferris, Glovsky & Popeo, P.C.

[57] ABSTRACT

A stencil of sheet metal for enabling solder paste to be applied to circuit boards includes a main body portion and opposite side regions which are apertured so as to be more flexible than the main body portion, and so as to enable these opposite side regions to be bent without kinking or other deformation during tensioning. The invention further includes an apparatus for enabling solder paste to be applied to a circuit board by a stenciling process, the apparatus including a stencil as described together with a support therefor, the stencil being attached to the support and being detachable therefrom. The side regions of the stencil are flexed for attachment to the support, so that the interconnection between the support and the stencil does not project beneath a lowermost planar surface of the stencil.

29 Claims, 6 Drawing Sheets

SUPPORT FRAME AND STENCIL HAVING FLEXIBLE END REGIONS FOR ATTACHMENT TO THE SUPPORT FRAME

This application is a file wrapper continuation application of Ser. No. 08/182,030, filed as PCT/GB93/01021 published as WO93/25061, Dec. 9, 1993 now abandoned.

BACKGROUND OF THE INVENTION

1. Field of the Invention

The present invention relates to an improved stencil or mask for use in applying solder paste on to circuit boards and to a support frame therefor.

2. Description of Related Art

It is known to produce electric circuit boards with solder connections for components, such as integrated circuit chips, by applying a solder paste to the circuit board by means very similar to screen printing. In one such known printing arrangement, a solder stencil or mask comprises a thin but still relatively stiff sheet of stainless steel or brass in which fine lines or apertures for the passage of solder paste have been formed, for example, by etching or laser cutting. The metal sheet is bonded to and supported by a thin peripherally surrounding flexible perforate sheet, of polypropylene or like, which in turn is bonded at its edges to a rectangular rigid metal frame. Such known arrangement is expensive and time-consuming to produce—particularly in view of the curing time necessary for the bonding of the adhesive. Additionally, the mesh and mask are not removably replaceable on the rectangular support frame without destruction of the mesh.

More recently it has been proposed to provide a rigid rectangular support frame wherein on two opposite sides and extending along a substantial part of the length thereof there are mechanical coupling means for interconnection with opposite sides of a metal printing stencil or mask with one mechanical coupling means being mounted on displaceable support means which are displaceable to tension the sheet when connected between the coupling means by suitable hydraulic, pneumatic or spring or mechanical tension devices as will be apparent to persons skilled in the art and well known. The mechanical coupling means includes two metal strips which underlie the normally lowermost surface of the mask sheet when in the operative position of the printing frame and mask and are coupled to the mask sheet along two opposite edges by means of a plurality of apertures in each strip at relatively large spacing and secured by screws, rivets or the like. While such arrangement is suitable for relatively small circuit boards, it does have the disadvantage of not permitting circuit boards of large area to be printed because of the projection of the opposite side strips of the mechanical coupling means beneath the lowermost surface of the mask. Additionally, the arrangement produces a very rigid mask when tensioned which may not allow for slight irregularities in the circuit boards which were tolerated by the first abovementioned arrangement.

SUMMARY OF THE INVENTION

It is an object of the present invention to provide an improved solder stencil or mask which may be readily mechanically connected with a supporting and printing frame such that the mechanical coupling means do not project below the lowermost surface of the mask in its operative position and, preferably, a mask which is readily detachably connectable to the support frame.

It is also an object of the present invention to provide a solder stencil or mask which has opposite sides modified so as to be more flexible than the main body of the sheets from which the mask is formed so as to be deflectable without kinking or other deformation or possibly consequential permanent deformation in the mechanical coupling with the support frame.

According to the present invention there is provided a solder stencil or mask having opposite side regions adapted or modified by being apertured or of reduced thickness so as to be more flexible than the main body of the sheet from which the mask is formed so as to enable the opposite side regions to be bent without kinking or other deformation in the mechanical coupling with a support frame and subsequent tensioning.

Still further according to the present invention there is provided an improved stencil or mask comprising a sheet of material more flexible than known mask sheets or having at least two opposite edges adapted to be more flexible than the main body of the sheet material to enable the opposite edges to be flexed out of plane of the main sheet of material for connection to tensioning means by interconnection means sufficiently closely spaced apart along the length of said edges to avoid or minimize any irregularity or distortion in the main body of the sheet.

Preferably the stencil or mask comprises a rectangular sheet, preferably of metal, which in two opposite edges have a plurality of parallel slots extending from each edge towards the other edge by an amount sufficient to make the edge sufficiently flexible as mentioned and sufficiently closely spaced to avoid or minimize any distortion in the main body of the sheet upon tensioning. The slots in opposite edges will preferably be aligned to avoid or minimize distortion.

Instead of slots or other apertures, other interengaging means may be provided on opposite edges of the sheet, for example, fingers or tines shaped to be interengageable with cooperating interengaging means of support means of the support frame for the stencil or mask as will be described hereinafter.

Also according to the present invention there is provided apparatus for supporting a stencil or mask of sheet material, comprising a support frame having two spaced apart parallel support members interengageable with opposite edges of the stencil or mask with at least one of said support members being displaceable so as to tension said sheet or mask of sheet material between said support members and wherein the main body of the mask in which apertures are provided for the passage of solder paste, lies in a plane when tensioned, characterized by the feature that interengageable or interengaging means are provided on the support members and on the stencil or mask such that when the mask is interengaged with the support members and in the tensioned condition, the interengaging means do not project beneath the lowermost surface of the main body of the sheet material of the mask in the normal position of use.

The support members have two lowermost surfaces proximate each other which may be planar and in the tensioned position lie in the same plane and lead in opposite and outward directions into an adjacent surface, preferably curved and possibly arcuate, which extends upwardly and away from the plane in which the normally lowermost planar surface lies in use such that the opposite edges of the mask sheet when interengaged with the support members and tensioned abut against said planar and said adjacent surface. Alternatively, the lowermost adjacent surfaces of the support members are each curved and extend from the plane of the upper surface of the mask in the position of use upwardly and away therefrom to the interengaging means. Preferably the opposite edges of the mask which are of increased flexibility or which are adapted to be of increased flexibility by said interengaging means, extend over said adjacent surface and preferably at least along a portion and along preferably half said planar surfaces.

The support members together with the interengaging means thereof which may be in the form of interdigitating shaped tines, will be displaceable, possibly by rotary movement, so as to displace the interengaging means i.e. the mechanical coupling parts out of and above the lowermost plane of the tensioned mask sheet.

It has been found that when the apparatus of the invention including the stencil or mask of sheet material is tensioned between the support members, that the support members will bow or flex inwardly and such may give rise to irregularities or inaccuracies.

To compensate for the possible bending of the support member or members caused by the pressure thereon in the operative position, it is proposed in a further embodiment that compensation means be provided in that the interengaging means on at least one support member are disposed, preferably by being arranged in an arc or curve, so that when tensioned the mask is not distorted in any way. Alternatively the supporting means may have a slight enlargement extending in an opposite direction to the bowing effect in use to compensate therefor. Alternatively the edges of the mask sheet may have a corresponding enlargement or shaped thickening as compensation means.

Preferably, however, the bowing compensation means comprises insertion means locatable between at least one edge of the stencil sheet and at least one support member and shaped and dimensioned such as to or assemble so as to fill in the space resulting from bowing as occurs in use to compensate for such and prevent or minimize any distortion of the sheet as would otherwise occur. Preferably, the insertion means comprises at least one shim or preferably a plurality of shims of different length arranged between the stencil sheet and each support member with the shorter shims being located adjacent each support member and the longer shims being located more adjacent each sheet—the shims being preferably centered on the support member and preferably located by having apertures through which the interengaging means (preferably teeth of the comb-like member) extend.

Alternatively, the bowing compensation means for each cross piece may comprise resilient means carried by each said support or each support member and which act on said stencil or mask when tensioned along the width thereof to compensate for any bowing effect.

Alternatively, bracing members may be located between the support members to either prevent bowing thereof or be extensible under pressure when the sheet is tensioned to remove the bowing or flexing effect.

In its broadest aspect, the present invention provides a stencil and support therefor which are interconnectable, and preferably detachably so, such that the interconnection means do not project beneath the lowermost planar surface of the stencil in its operative position and such is preferably achieved by displacing edge regions of the stencil sheet where interconnection is effected upwardly out of said lowermost plane although this may be achieved by interconnection means which engage with the upper surface or projections (e.g. upwardly projecting tangs) therefrom of said planar stencil sheet.

According to a further aspect of the invention there is provided an improved stencil or mask comprising a sheet of material having at least one side which has a reinforcing or stiffening means extending therealong to reduce any sagging of the sheet as would otherwise exist in its position of use.

Preferably although not essentially, the mask sheet will be such as described and/or illustrated herein and the stiffening means are provided along the opposite unsupported edges/sides of the sheets which extend between the supporting means and preferably comprise L-shaped or flat rigid bars secured to and extending along the normally upper surface of the sheet. The stiffening means may also be provided along opposite side regions which are between the apertured opposite side regions.

It will be appreciated that the various features together or separately also considerably improve the accuracy of the printing operation and the resultant circuit boards.

BRIEF DESCRIPTION OF THE DRAWINGS

The invention will be described further, by way of example, with reference to the accompanying drawings, in which.

DESCRIPTION OF THE PREFERRED EMBODIMENTS

Figure 1:
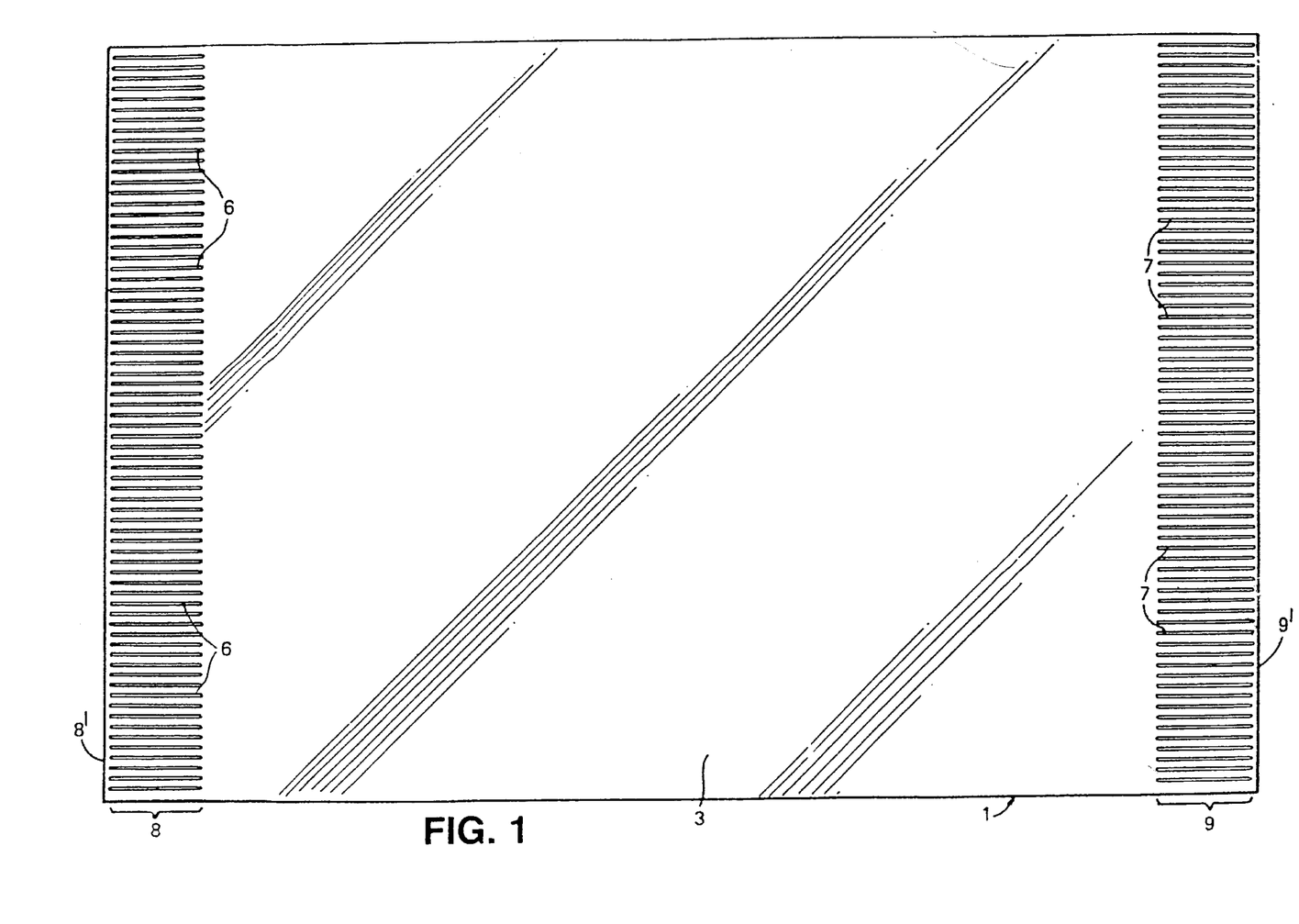
FIG. 1 is a plan view of a preferred embodiment of a symmetrical stencil or mask of thin metal sheet material wherein the opposite identical edge portions each have a plurality of identical slots aligned with respect to the slots on the opposite side and of lengths such as to provide first interengaging means and the required flexibility at the edge portions to fit around curved portions of support members of the support frame.

FIG. 1 illustrates the embodiment of a solder stencil or mask 1 for use in a support apparatus 2 (not shown) and for printing solder paste on an electric circuit board which is subsequently to be heated to form the necessary circuits.

The mask 1 is made of a thin sheet of metal, such as stainless steel or brass and comprises a main portion 3 in which the necessary lines or other apertures 4 (not shown in FIG. 1) are formed by etching or laser cutting or the like (not shown) and through which solder paste passes on to a circuit board 5 when placed beneath.

Opposite identical edges of the sheet 1 have identical interconnection means 6 and 7 provided in the form of a row of closely spaced, narrow parallel slits or slots 6,7 which extend over sufficient length as to make the end edges 8,9 of the metal sheet more flexible than in the main body portion 3 to enable the edges to be bent out of the plane in which the main body 3 lies in the tensioned condition.

The slots 6,7 are parallel and also aligned with the identical slots 7,6 on the opposite edge 9/8.

Figure 2:
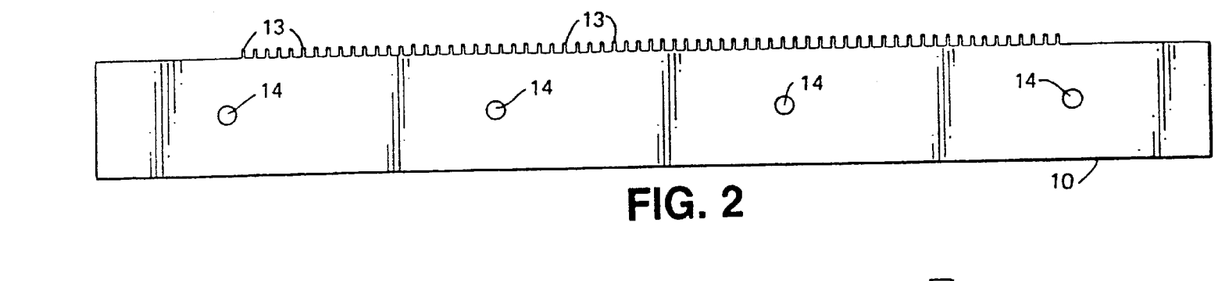
FIG. 2 is an example of a preferred embodiment of one of two second interengaging means cooperable with such means of the mask—one of each of such means being mountable on opposite support members and having a plurality of fingers extending therefrom interengageable with the slots of the sheet member.

FIG. 2 illustrates one of two interconnection members 10 with each being identical and securable to a support member 11,12 as will be described later and has a plurality of interconnection projections 13 extending from an edge thereof which are shaped and dimensioned and spaced so as to fit into the slots 6,7 of the edges 8,9 of the mask sheet 1 and be displaceable towards the outermost edge 8',9' so as to abut the ends of the slots and cause the edges of the sheet to be bent slightly out of the plane in which the main body 3 of the sheet 1 lies. Four apertures 14 are provided for securement of the interconnection members 10 on support member 11,12.

The spacing and dimensioning of the slots 6,7 at the end of the sheet 1 (other apertures or even projections may be provided) are such as to achieve flexing without permanent deformation and also such as to ensure an even tensioning without distortion of the main sheet 1.

Figure 3:
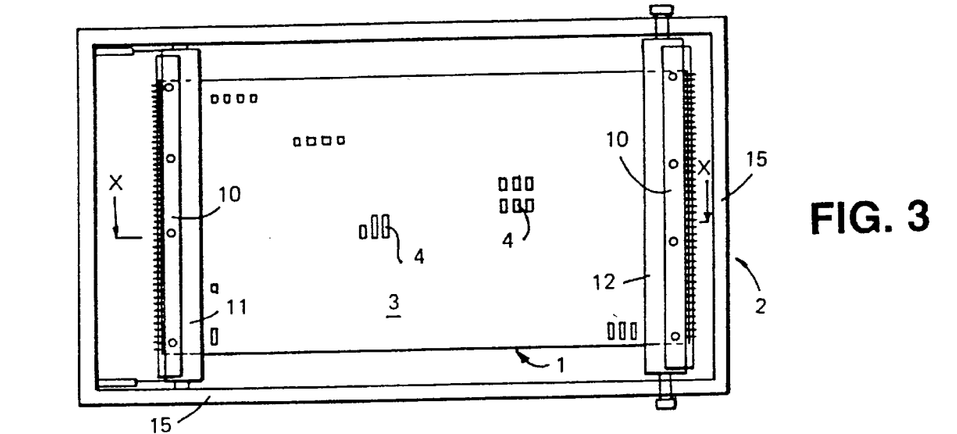
FIG. 3 is a schematic plan view from above of a support apparatus and mask connected thereto.
Figure 4:
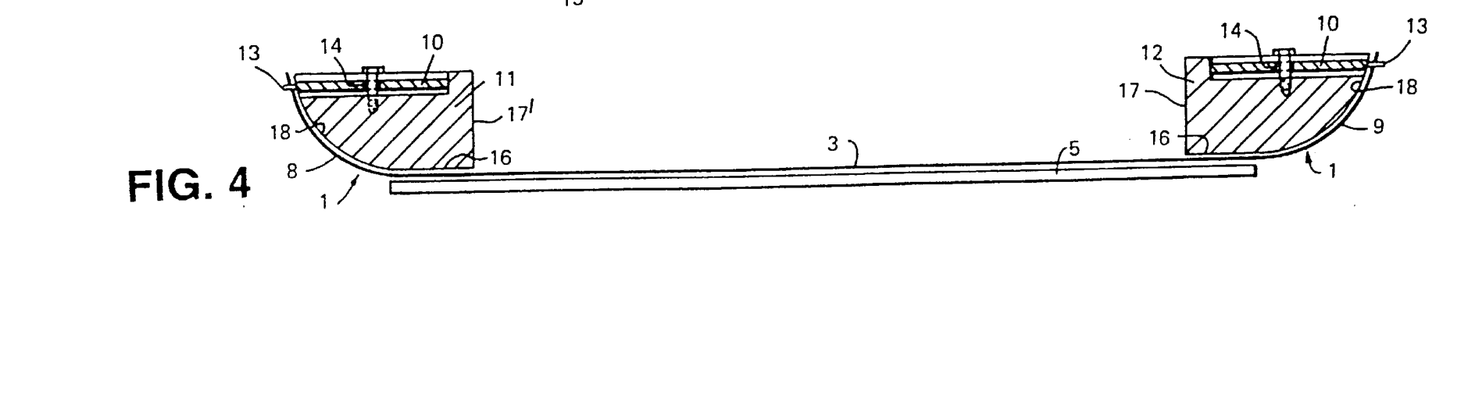
FIG. 4 is a schematic enlarged section on the line X—X of FIG. 3 illustrating the mounting of the mask sheet on the interengaging means of the support members of the support frame.

FIGS. 3 and 4 illustrate a support frame 15 having first support member 11 at one edge for carrying connection member 10 and second support member 12 which is displaceably mounted in the frame and displaceable by suitable known means such as hydraulic rams or locking lever means (not shown) to provide tension of the sheet. The first member 11 may be fixed against lateral displacement but rotatably displaceable and securable. Either member 11,12 may be rotary to achieve displacement of projections 13 out of the plane in which the main portion 3 lies. Preferably, however, one support member forms an end cross-piece of frame 15 and is fixed in position while the other support member also forms an end cross-piece of the frame parallel to said other end cross-piece and is pivotally mounted on the end of the side pieces and displaceable by means of a lever acting through a locking linkage similar to such used in Mole grip tools (possibly a locking toggle type lever linkage) so as to displace said support member and lock such in the tensioning position.

The shape of the bottom of each support member 11,12 is preferably identical but oppositely facing and has a planar or flat portion 16 leading from a perpendicular face 17,17' and outwardly and smoothly into a curved surface 18 against which edge portions 8,9 are tensioned.

Interengaging means or comb-like members 10 as shown in FIG. 2 are bolted to support members 11,12. The lower surfaces of each support member 11,12 comprises a flat planar portion 16 leading from an upwardly extending portion 17' with said planar portions 16 lying in the same plane and each planar portion 16 extends smoothly into a curved portion 18 which leads upwardly and away from said plane.

The mask 1 has one edge portion 8 positioned on the first interconnection member 10 with the projections 13 thereof extending into the slots 6 and the other edge portion 9 is located on the second interconnecting member 10 with the projections thereof located in the slots 7 thereof and the second support member 12 is displaceable by displacement means (not shown) such as a hydraulic or pneumatic means or spring means arranged so as to achieve even and parallel displacement of the support member 12 relative to member 11 to tension the sheet member 1 and hold such in position during the printing operation. Solder paste (not shown) is applied from above the top surface of the mask between the support members and flows through apertures 4 formed therein to a circuit board 5 located underneath to achieve accurate deposition on the board which is subsequently heat treated or the like. It will be appreciated that if the circuit board is of such size as to extend under the support members 11,12 no adverse effect is produced because the interconnection means (13,6,7) is located out of the plane in which the lowermost surface of the main body 3 of the mask sheet 1 lies, and out of the plane in which the uppermost surface of the circuit boards lies, these planes normally being the same.

Both of the support members 11,12 may be arranged to execute rotary movement and such rotary movement may even effect the necessary tensioning.

It is preferred that the length of the slots 6,7 in each edge of the mask sheet 1 is such to extend from the interconnecting means (13) downwardly to at least half the width of the lowermost planar surface 16 of the support members.

It is important that the edges 8,9 of the sheet 1 are made sufficiently flexible, for example, by slotting or other aperturing or even thinning so as to enable flexing without distortion, and that the interconnection means not be at widely spaced points such as would cause a distortion but should be very closely spaced to ensure an even distribution of pressure over the whole width of each edge when the tensioning is applied. In this manner it is thus possible to avoid the transmission of any tensioning distortions to the main body of the mask.

It is even envisaged that the slots or like extend beyond the lowermost surface of the support members; this will give sufficient flexibility to the mask to accommodate uneven circuit boards.

Figure 5:
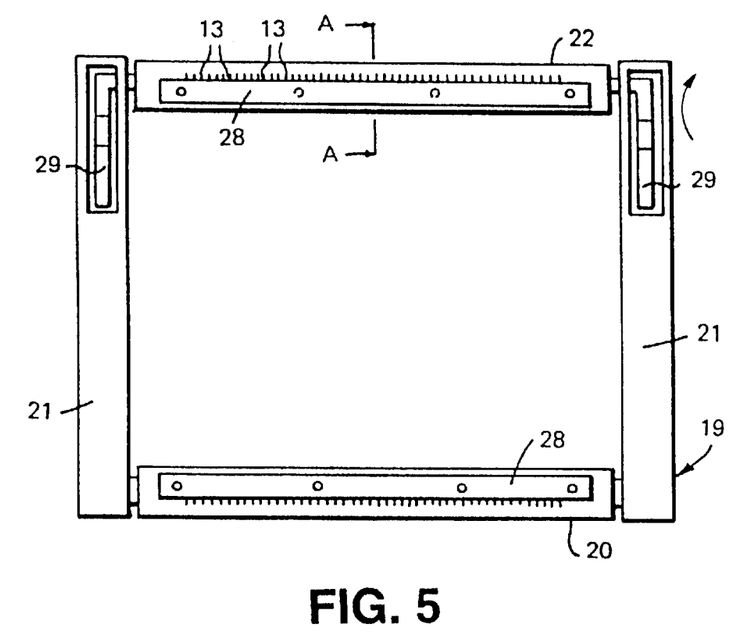
FIG. 5 is a schematic inverted plan view of an alternative and preferred embodiment of the invention and including flexing or bowing compensation means.

FIG. 5 illustrates an alternative and preferred embodiment of the invention which comprises a rectangular support frame 19 of hollow box metal section having a first support member or cross-piece 20 which is fixed relative to side frame members 21 and a second support member or cross piece 22 which interconnects the opposite ends of side members 21 and is rotatable relative thereto.

Figure 6:
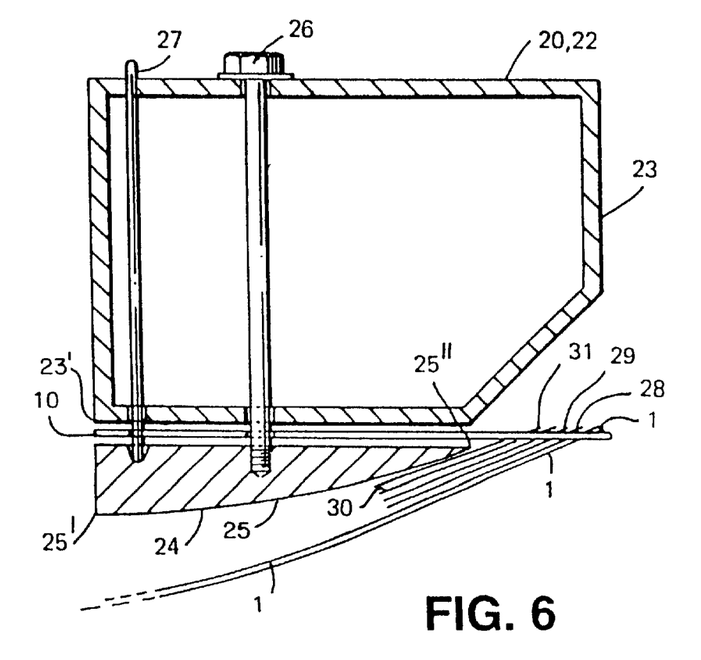
FIG. 6 is an enlarged fragmentary cross-section through a modified support member of the apparatus of FIG. 5 and illustrating an uppermost bowing compensation means.

The cross-pieces 20, 22 are of similar construction apart from their mounting within frame 19 and each include interconnection members 10 having a plurality of interconnection members or teeth 13. FIG. 6 is a section in the line A—A of FIG. 5 and rotated through 180° (to correspond to the disposition of FIG. 4 which shows an alternative part arrangement). Each cross-piece 20, 22 is in two parts and comprises a main box section 23 of aluminum and a clamping plate 24 of aluminum whose lower surface 25 is a continuous curve between edge points 25' and 25" and flat/planar surface 23' on box section 23 is tangential to point 25". The steel comb-like interconnection member 10 is sandwiched between plate 24 and box section 23 and secured by screws 26 (only one shown). Location or dowel pins 27 are provided between the cross-piece sections which also increase the stiffness of the structure. A plurality, four by way of example, of compensation means for the flexing of each of the cross-pieces are provided in the form of shims 28–31 and located in position between surface 25 and mask sheet 1 having apertures therein located over the teeth of member 10. The mask sheet 1 is located so that the teeth 13 extend through the slots 6, 7 thereof and rotation of cross-piece 22 by levers 29 which operate a lever linkage somewhat in the manner of a Mole wrench or locking toggle lever arrangement (not shown) located in the box section of sides 21 and operable to rotate the teeth 13 of cross-piece 22 away from those of cross-piece 20 and thus tension the mask sheet 1 in the position of use. The cross-piece 22 is temporarily located in the tensioned position in use with the levers 29 being positioned in recesses in the side frames 21. The cross-piece may be released by moving levers 29 in the opposite direction to rotate teeth 13 thereof in the opposite direction to enable sheet 1 to be removed.

Figure 7:
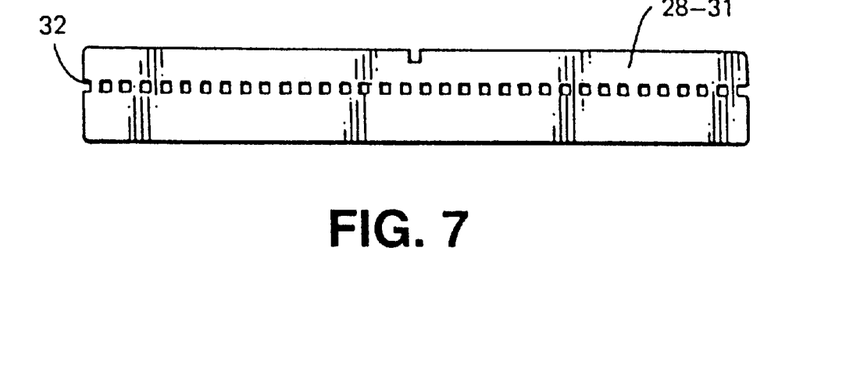
FIG. 7 is a plan view of a single shim member suitable for use as a flexing or bowing compensation means.
Figure 7A:
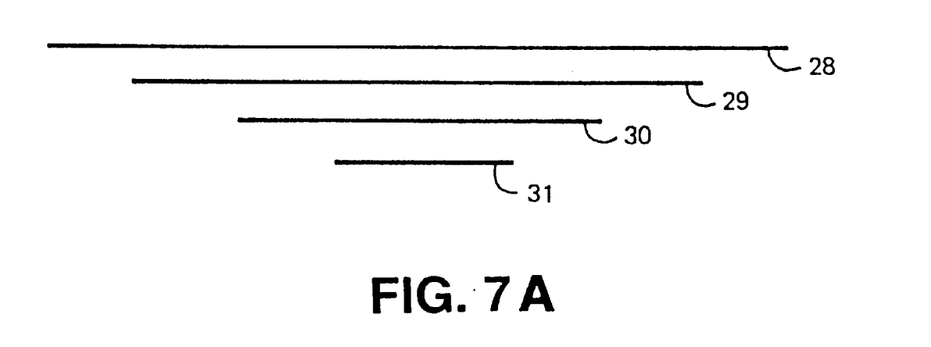
FIG. 7A is a schematic illustration of a disposition of a four shim arrangement on one cross piece.

Compensation shims 28–31 of different length are centrally disposed stepwise on each cross-piece 20, 22 with the shortest 31 being in the center and most adjacent surface 24 and the longest and outmost abutted by sheet 1. The holes 32 in the shims receive the teeth 13.

Figure 8:
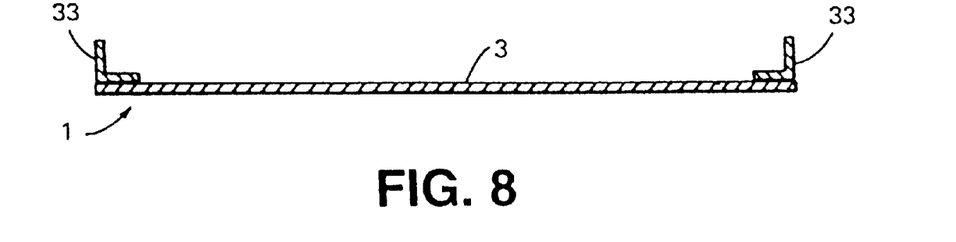
FIG. 8 is a sectional view through a stencil or mask sheet having lateral stiffening means and forming a separate inventive development.

FIG. 8 is a sectional view through a mask sheet having stiffening means provided on opposite lateral sides on the normally upper surface and may form a modification or improvement of the present invention or an adaption to existing mask screens and constitutes an invention in its own right.

In FIG. 8 two rigid, L-shaped and oppositely facing aluminum extrusions 33 are bonded by a double sided adhesive strip or other means to the opposite lateral upper edges of a mask sheet 1 to provide reinforcement and to prevent sagging of the sheet in operation and/or to facilitate handling or act as protection means. A flat strip or bar may even be provided. Other alternative reinforcing or strengthening means may be provided along the edge and such as to provide improved efficiency and performance in operation. The reinforcement or strengthening may be incorporated in the stencil or mask of the present invention described herein or may alternatively adapt existing screening masks.

Figure 9:
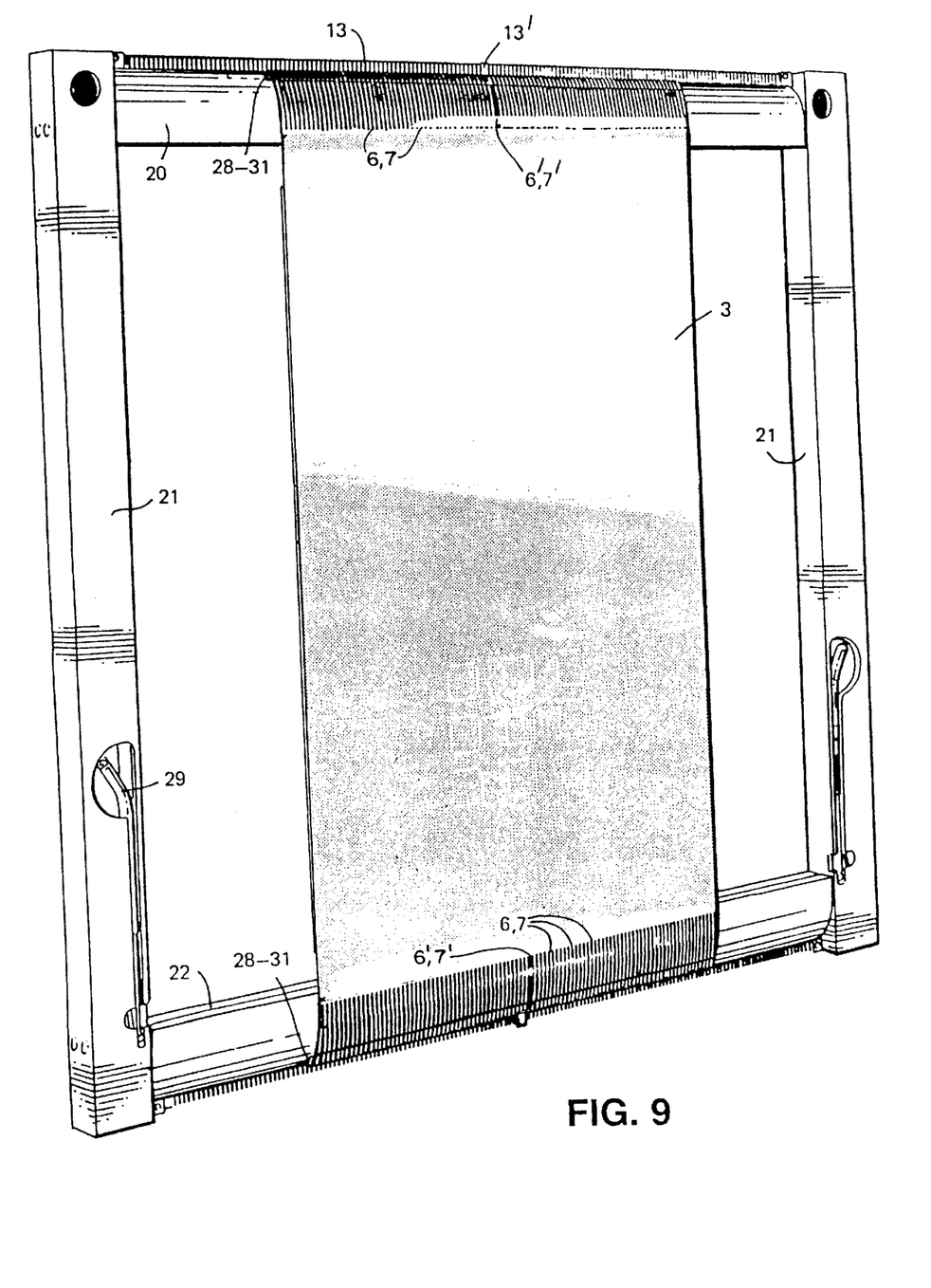
FIG. 9 is a perspective view of a preferred embodiment of an apparatus according to the invention upstanding on one end and including a tensioned stencil or mask.
Figures 10, 11:
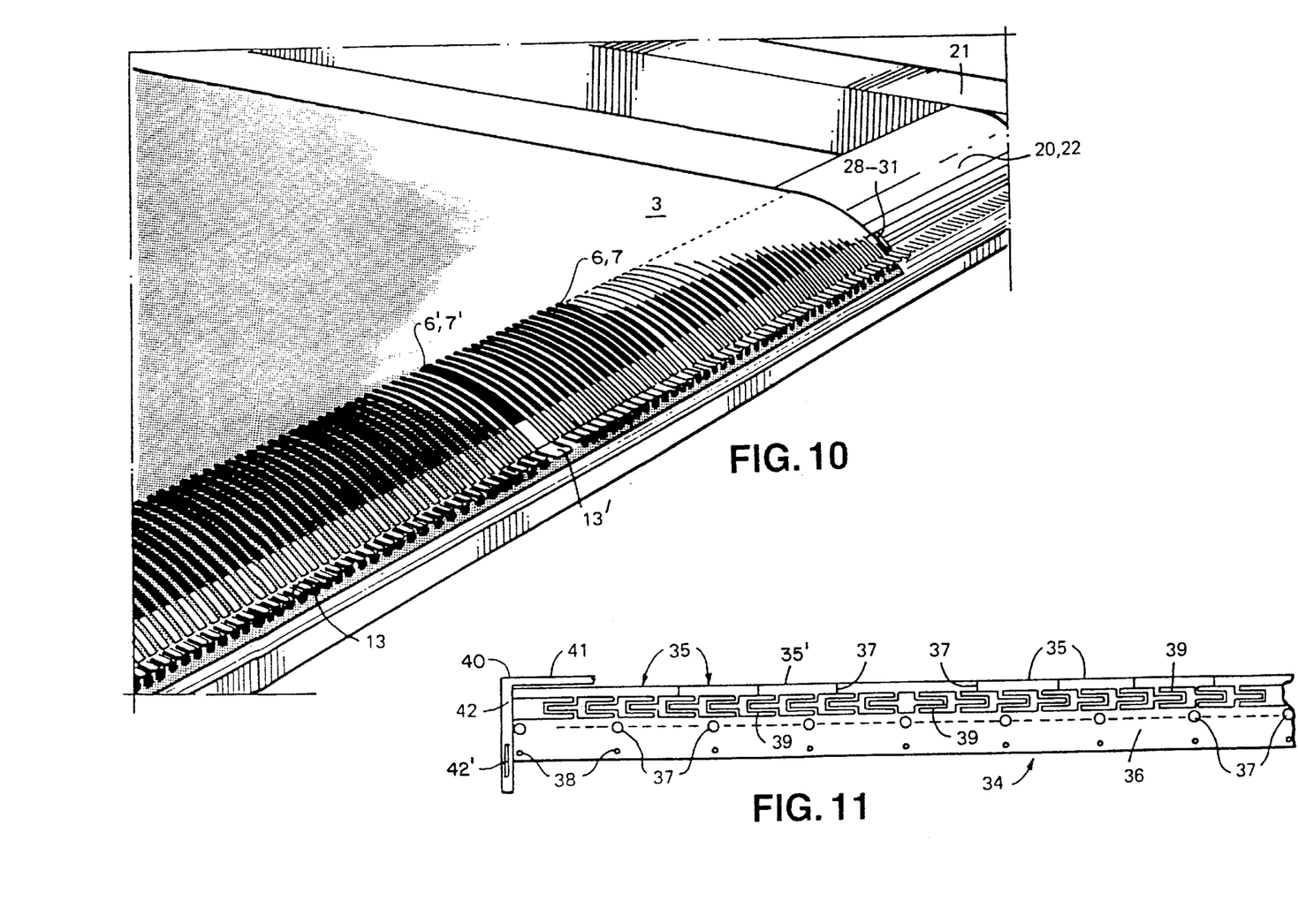
FIG. 10 is a fragmentary perspective view of one end of the frame having the end of a mask located thereon and illustrating the flexing edge region of the mask.
FIG. 11 is a plan view of an alternative compensation means for compensating flexing or bowing of the support frame cross pieces.

FIGS. 9 and 10 illustrate a preferred embodiment of the apparatus according to the invention very similar to that of FIGS. 5 and 6 but being inverted and with the mask 1 being tensioned. Accordingly, the same reference numerals are applied as in FIGS. 5 and 6 and the description in respect thereof generally applies to this embodiment also except insofar as the bowing compensation means is concerned—see FIG. 11.

FIG. 11 is a plan view of an alternative tensioning device or bowing compensation means in the form of a flat spring plate 34 which replaces shims 28–31 of FIG. 6. Spring plate 34 is of resilient metal and is to be located between box section 23 and clamping plate 24 shown in FIG. 6 and specifically between each comb-like interconnection member 10 and plate 24 with its spring portion 35 extending beyond the edge of plate 24 to abut mask sheet 1. Plate 34 has a generally rectangular mounting portion 36 having nine main mounting apertures 37 through which securing screws 26 extend and has nine smaller apertures 38 through which location pins 27 extend.

The spring portion 35 comprises a front, abutting portion 35' connected to the main body and mounting portion by a plurality of flat generally U-shaped spring arm portions 39 which resiliently bend when a load is applied to front portion 35'. In a preferred arrangement front portion 35' is in fact formed as a plurality of sections by very thin dividing cuts 37 being formed along the length.

In use, when the mask is tensioned on the projections 13 and not abutting the main body of the interconnection members at the root of the projections 13, the front portion 35' of the spring plate 34 abuts the strips defining the slots 6, 7 in the edge region of mask 1 and are pressed inwards against the action of spring arm portions 39. Since bowing or flexing of the frame cross pieces 20, 22 occurs to a greater extent towards the middle thereof, the spring arm portions 39 towards the center may push the associated parts of abutting portion 35' into greater contact with mask 1 or to exert greater pressure thereon to compensate for the bowing of the cross piece and avoid or minimize any irregularities.

A keeper 40 is provided on each cross piece 20, 22 to facilitate the mounting of the mask 1 on the projections 13 and comprises a strip 41 (only shown in part in FIG. 11) which extends along the length of the cross piece and has a mounting arm 42 portion extending at right angles therefrom at each end (only one end shown in FIG. 11). A spring step portion 42' is provided in each arm 42. The keeper 40 is displaceably mounted on each cross piece adjacent the sides of mask 1 and may be extended to permit the slotted end region of mask 1 to be located over projections 13 and then retracted to abut mask 1 on the upper side of projections 13 to retain the mask 1 in position on projections 13 while tensioning is effected or while the other end of mask 1 is connected to the other projections 13 of the other cross piece.

In FIGS. 9 and 10 a central larger locating projection 13' is provided on each interconnection means 10 and over which a larger sheet 6', 7' of mask 1 is locatable for achieving desired alignment.

It will be appreciated that many modifications of embodiments may be effected without departing from the scope of the present invention. For example, instead of slots or other apertures closely spaced in two opposite edges of the sheet of the mask, a plurality of projections may be provided shaped so as to inter-engage with shaped apertures on interconnection means 10 on the support members 11, 12. Alternatively, the edge regions may be formed with reduced thickness to facilitate bending or flexing in the required region.

What is claimed is:

1. Apparatus for enabling solder paste to be applied to a circuit board by a stenciling process, comprising a stencil of sheet metal, and support means therefor, and interconnection means for attaching said stencil to said support means and detaching therefrom, said stencil comprising a main body portion with holes for the passage of paste and at least two opposite side regions comprising apertures so as to be more flexible than the main body of the stencil, and enable thereby the side regions of the stencil to be flexed for attachment to the support means so that the interconnection means associated with said support means do not project beneath a lowermost planar surface of the stencil, wherein the support means comprises at least one displaceable support member carrying the interconnection means of the support means, means for allowing displacement of the support member, and a bending surface and the stencil is flexed against said bending surface and tensioned on the support means by displacement of said at least one support member.

2. Apparatus as claimed in claim 1, wherein said apertures also functions as said means for interconnecting the stencil with the support means, said apertures being sufficiently closely spaced apart along the length of said side regions to avoid or minimize any irregularity or distortion in the main body of the stencil when tensioned.

3. Apparatus as claimed in claim 1, wherein the apertures comprise a plurality of closely spaced, elongated slots.

4. Apparatus as claimed in claim 3, wherein one of said slots is a larger aligning slot aligned with a larger aligning slot in the opposite side region for aligning the stencil on the support means.

5. Apparatus as claimed in claim 1, wherein the support means comprises a first support means which is fixed and the support member comprises levers which displace the support member such that projections forming the interconnection means of the support member move into said apertures of the stencil and are rotated into a tensioning position.

6. Apparatus for enabling solder paste to be applied to circuit boards by a stenciling process, comprising a stencil and a support frame including two spaced apart parallel support members and interconnection means on said support members with said support members being detachably interengageable, by said interconnection means, with apertures in at least two opposite side regions of the stencil forming interconnection means of the stencil, with at least one of said support members including means for reversibly, displaceably and rotatable mounting said at least one of said support members in the support frame from a stencil mounting/dismounting position to a stencil tensioning position so as to tension said stencil between said support members, each of the support members having said interconnection means extending therefrom in the form of a plurality of closely spaced comb-like teeth;

said stencil being formed of a thin sheet of metal and the apertures in each side region being elongate slots, closely spaced and aligned with the slots forming the apertures in the opposite side region and receiving said comb-like teeth;

said stencil and support members being located such that when the stencil is mounted on the support members, said at least two opposite side regions of the stencil are flexed over the support members and the interconnection means of the support members do not project beneath a lowermost planar surface of the stencil.

7. Apparatus as claimed in claim 6, wherein each opposite side region has a central slot larger than other slots therein for aligning the stencil on the support members.

8. Apparatus as claimed in claim 6, additionally comprising a reinforcing or stiffening means extending along at least one side of the stencil.

9. In combination, a stencil of sheet metal and an apparatus for supporting said stencil for enabling solder paste to be applied to circuit boards in a stencilling process, comprising:

a support frame having two spaced apart parallel support members, said support members including interconnection means for interengaging said support members with opposite side regions of the stencil, at least one of said support members including means for displacing said at least one of said support members into a tensioning position so as to tension the stencil between said support members, said at least one of said support members having a bending surface for bending said opposite side regions of the stencil, and in a tensioning position the interconnection means of the support members not projecting beneath lowermost stencil-supporting surfaces of the support members, wherein said opposite side regions of the stencil comprise apertures for engaging with the interconnection means and to increase flexibility and extend over said bending surface.

10. Apparatus as claimed in claim 9, wherein the two lowermost surfaces, in the tensioning position of the support members, lie in the same plane and lead in opposite and outward directions into said bending surface which extends upwardly and away from the plane in which the lowermost surfaces lie, such that the opposite side regions of the stencil when interengaged with the support members and tensioned, abut against said lowermost surfaces and said bending surface.

11. Apparatus as claimed in claim 10, wherein said bending surface is curved.

12. Apparatus as claimed in claim 9, wherein the bending surface is curved and extends from the plane of the upper surface of the stencil upwardly and away therefrom to the interconnection means for interengaging.

13. Apparatus as claimed in claim 9, wherein said means for displacing said at least one support member displaces the interconnection means thereof, thereby to displace the interconnection means for interengaging out of and above the lowermost stencil supporting surface for the stencil under tension.

14. Apparatus as claimed in claim 13, wherein said said displacement means is rotary.

15. Apparatus as claimed in claim 9, wherein the apertures comprise a plurality of parallel slots, wherein the interconnection means of the support members are projections which interdigitate in said slots.

16. Apparatus as claimed in claim 1, 6 or 9, wherein to compensate for possible bending of the support member caused by the tensioning thereon, compensation means are provided by insertion means located between at least one edge of the stencil and at least one said support member and shaped and dimensioned such as to or assemblable so as to fill in any space resulting from bending to compensate for such and prevent or minimize any distortion of the stencil.

17. Apparatus as claimed in claim 16, wherein said compensation means comprises resilient means carried by said support member.

18. Apparatus as claimed in claim 17, wherein said resilient means comprises a flat spring plate having a mounting portion of said plate and a plurality of spring arms extending therefrom and connected to or running into a portion which abuts said stencil.

19. Apparatus as claimed in claim 18, wherein said abutting portion is divided into a plurality of discrete parts.

20. A stencil of sheet metal for enabling solder paste to be applied to circuit boards, comprising a main body portion and opposite side regions which are apertured or of reduced thickness so as to be more flexible than the main body portion, and thereby enable the opposite side regions to be bent along said regions without kinking or other deformation during tensioning, wherein stiffening or reinforcing means is provided along opposed side regions which are between said opposite side regions.

21. A stencil as claimed in claim 20, wherein the apertures in said opposite side regions are aligned to avoid or minimize distortion.

22. A stencil as claimed in claim 20, wherein the stiffening means comprises an L-shaped or flat rigid bar secured to and extending along an upper surface of the stencil.

23. A stencil of sheet metal for enabling solder paste to be applied onto circuit boards and comprising a main body portion with apertures for passage of solder paste and at least two opposite side regions along which the stencil is to be flexed, said at least two opposite side regions being made more flexible than the main body portion by each having a plurality of closely spaced elongated slots in the form of a grating or grille, and also forming interconnection means for connection to tensioning means, said slots extending substantially over the length of the side regions, being of a width substantially the same as portions of the side regions which separate adjacent slots, and being sufficiently closely spaced apart along the length of said side regions to avoid or minimize any irregularity or distortion in the main body portion of the sheet when tensioned, whereby said side regions are sufficiently flexible that placement of said stencil under tension enables a portion of said side regions to be bent out of a single plane in which there is the main body of the stencil and the remainder of the side regions.

24. A stencil of sheet metal for enabling solder paste to be applied onto circuit boards, comprising a main body portion with apertures for passage of solder with at least two opposite side regions made more flexible than the main body portion by being apertured by a plurality of elongated slots forming a grating or grille structure to enable the opposite side regions to be flexed out of a plane of the stencil and also to provide stencil interconnection means for connection with interconnection means of a support and tensioning means, said slots extending substantially over the length of the side regions, being of a width substantially the same as portions of the side regions which separate adjacent slots, and providing said stencil interconnection means and being sufficiently closely spaced apart along the length of said side regions to avoid or minimize any irregularity or distortion in the main body portion, whereby said side regions are sufficiently flexible that placement of said stencil under tension enables a portion of said side regions to be bent out of the plane in which there is the main body of the stencil and the remainder of the side regions.

25. A stencil of sheet metal for enabling solder paste to be applied onto circuit boards and having opposite side regions made sufficiently flexible by a plurality of elongated, narrow slots having a width substantially equal to portions of the side regions which separate the slots and forming a grating or grille structure to enable flexing without irregularities or distortion and, for connection to tensioning means, interconnection means provided by said slots which are sufficiently closely spaced apart along said side regions to avoid or minimize any irregularity or distortion of the stencil when tensioned, wherein the interconnection means further includes a central slot larger than other of said slot and provided in each of said side regions for aligning the stencil on a support.

26. A stencil as claimed in claim 25, wherein the slots of one side region are aligned with the slots in the opposite side region.

27. Apparatus for enabling solder paste to be applied onto circuit boards in a stenciling process, comprising a stencil of thin sheet metal including interconnection means comprising a plurality of closely spaced elongate slots in opposite side regions forming a grating or grille structure, and support for the stencil, said slots extending substantially over the length of the side regions, being of a width substantially the same as portions of the side regions which separate adjacent slots, being detachably interconnectable by means comprising closely spaced projections on opposite sides of the support engaging in abutting relationship in said closely spaced slots, in opposite side regions of the stencil, and interconnectable such that the stencil can be tensioned on the support and flexed or bent thereby so that the projections of the support do not project beneath a lowermost planar surface of the stencil.

28. Apparatus for enabling solder paste to be applied to a circuit board by a stenciling process, comprising a stencil of sheet metal and support means therefor, said stencil comprising a main body portion with apertures for the passage of paste and at least two opposite side regions adapted with apertures or of reduced thickness to be more flexible than the main body of the stencil;

said stencil being attached to said support means through interconnection means of the stencil and the support means, and being detachable therefrom, the side regions of the stencil being flexed for attachment to the support means so that the interconnection means associated with said support means do not project beneath a lowermost planar surface of the stencil, wherein said support means comprises compensation means to compensate for possible bending of the support means, said compensation means comprising resilient means carried by each said support means and which acts on said stencil when tensioned along a width thereof to compensate for any bending, said resilient means comprising a flat spring plate having a mounting portion and a plurality of spring arms extending therefrom and connected to or running into a portion which abuts the stencil.

29. Apparatus as claimed in claim 28, wherein said abutting portion is divided into a plurality of discrete parts.

* * * * *